(12) United States Patent
Inoue

(10) Patent No.: US 7,476,897 B2
(45) Date of Patent: Jan. 13, 2009

(54) SOLID-STATE IMAGING DEVICE

(75) Inventor: Tomoki Inoue, Asaka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/785,199

(22) Filed: Apr. 16, 2007

(65) Prior Publication Data

US 2007/0241376 A1 Oct. 18, 2007

(30) Foreign Application Priority Data

Apr. 17, 2006 (JP) .......................... P2006-113644

(51) Int. Cl.
*H01L 29/04* (2006.01)
(52) U.S. Cl. ........................................ 257/59; 257/222
(58) Field of Classification Search .................. 257/59, 257/222
See application file for complete search history.

(56) References Cited

U.S. PATENT DOCUMENTS

2005/0219392 A1* 10/2005 Suzuki ........................ 348/294

FOREIGN PATENT DOCUMENTS

JP 2002-83946 A 3/2002

* cited by examiner

*Primary Examiner*—Douglas M Menz
(74) *Attorney, Agent, or Firm*—Birch, Stewart, Kolasch & Birch, LLP

(57) ABSTRACT

A solid-state imaging device is provided and includes: a semiconductor substrate; a plurality of photoelectric conversion films stacked above the semiconductor layer and absorbing different wavelength regions of light; and a transmission-blocking film at least one between the plurality of photoelectric conversion films, the transmission-blocking film blocking a transmission of a particular region of light, the particular region of light having a wavelength in a region to be absorbed in a photoelectric conversion film located above and nearest to the transmission-blocking film.

4 Claims, 3 Drawing Sheets

SOLID-STATE IMAGING DEVICE

BACKGROUND OF THE INVENTION

1. Field of the Invention

The present invention relates to a solid-state imaging device having a plurality of photoelectric conversion films stacked above a semiconductor substrate and for absorbing different wavelength portions of light.

2. Description of Related Art

There is proposed a solid-state imaging device having a semiconductor substrate over which are stacked, in a plurality of levels, photoelectric converters each including a photoelectric conversion film that absorbs light and generates an electric charge in an amount commensurate therewith, a pixel electrode film where to move, of the charges generated at the photoelectric conversion film, the charge for use in producing image data, and a counter electrode film provided opposite to the pixel electrode film with respect to the photoelectric conversion film (see JP-A-2002-83946, for example). JP-A-2002-83946 discloses a structure stacking, as a photoelectric converter, an R photoelectric converter including a photoelectric conversion film to detect red (R), a G photoelectric converter including a photoelectric conversion film to detect green (G) and a B photoelectric converter including a photoelectric conversion film to detect blue (B), in this order.

However, in the structure photoelectric conversion films are stacked as in the solid-state imaging device described in JP-A-2002-83946, the unabsorbed portion of light in the upper photoelectric conversion film is to enter the another photoelectric conversion film, thus raising a concern that color separation is not fully done.

SUMMARY OF THE INVENTION

An object of an illustrative, non-limiting embodiment of the invention is to provide a solid-state imaging device capable of separating colors to a full extent.

According to an aspect of the invention, there is provided a solid-state imaging device including: a semiconductor substrate; a plurality of photoelectric conversion films stacked above the semiconductor layer and absorbing different wavelength regions of light; and at least one transmission-blocking film between the plurality of photoelectric conversion films, the transmission-blocking film blocking a transmission of a particular region of light, the particular region of light having a wavelength in a region to be absorbed in a photoelectric conversion film located above and nearest to the transmission-blocking film.

In the solid-state imaging device, the transmission-blocking film may absorb the particular region of light to block the transmission of the particular region of light.

In the solid-state imaging device according to claim 1, the transmission-blocking film may transmit a wavelength region of light, the wavelength region being absorbed in a photoelectric conversion film located lower than the transmission-blocking film.

The solid-state imaging device may include a light-reflection film between the semiconductor substrate and a photoelectric conversion film located nearest to the semiconductor substrate.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

Although the invention will be described below with reference to the exemplary embodiment thereof, the following exemplary embodiment and its modification do not restrict the invention.

According to an exemplary embodiment of the invention, a solid state imager capable of separating colors to full extent can be provided.

With reference to the drawings, explanation will be made on an exemplary embodiment according to the present invention.

Figure 1:
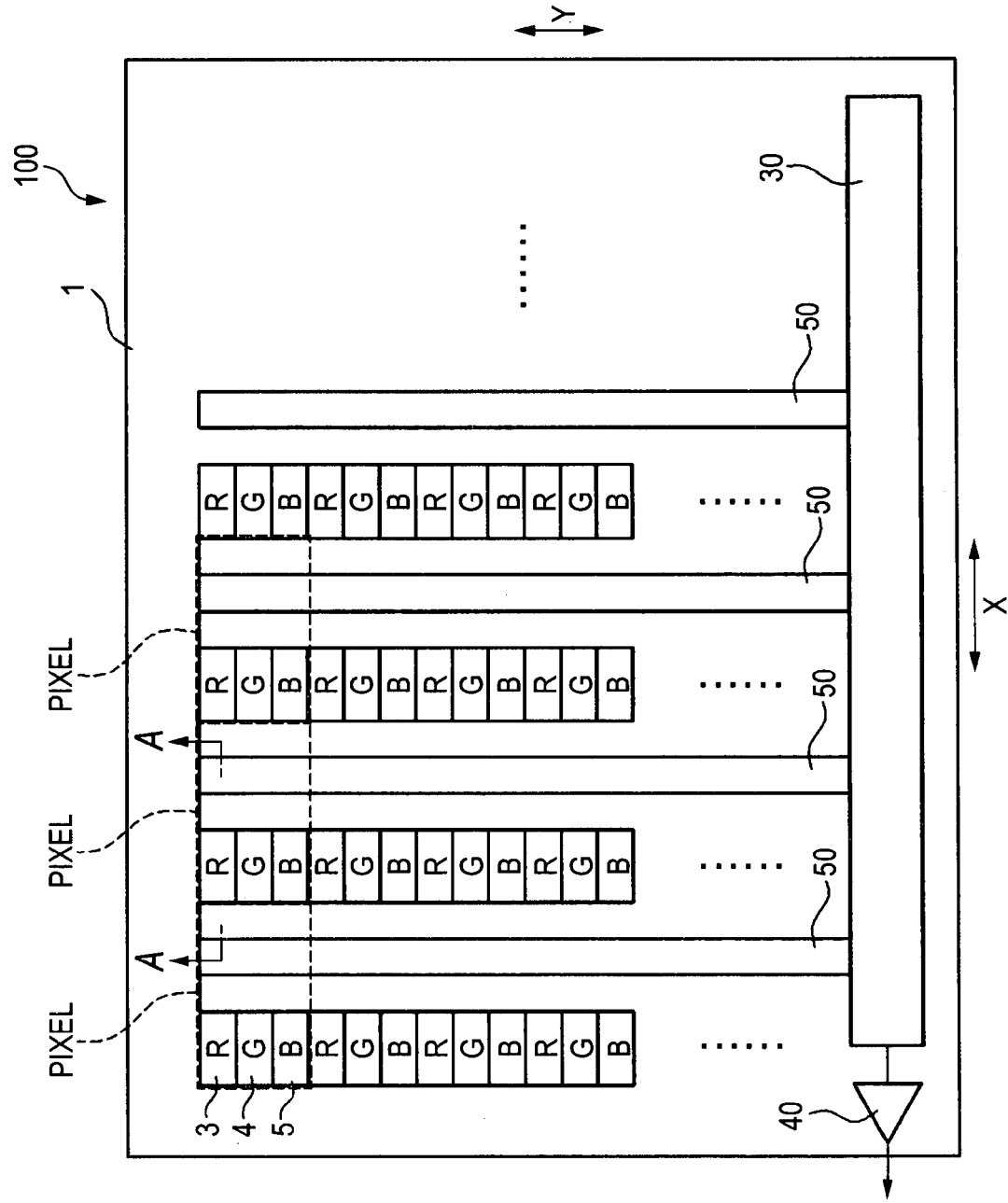
FIG. 1 is a plan view of a solid-state imaging device according to an exemplary embodiment of the invention.
Figure 2:
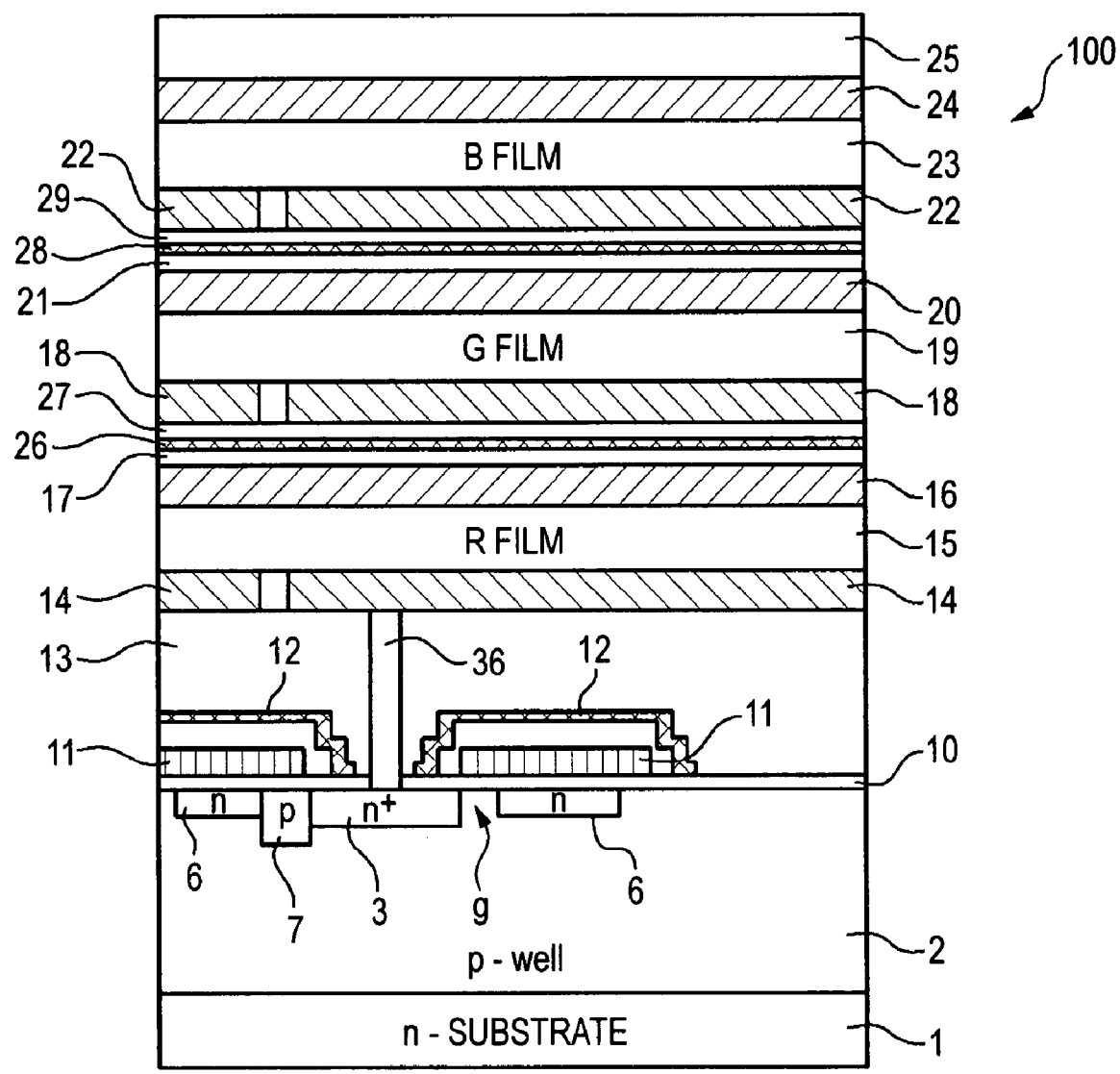
FIG. 2 is a sectional view of the FIG. 1 solid-state imaging device, taken on line A-A.

FIG. 1 is a plan view of a solid-state imaging device for explaining the embodiment of the invention. FIG. 2 is a sectional view of the FIG. 1 solid-state imaging device taken on line A-A.

As shown in FIG. 2, over an n-type semiconductor substrate 1, there are stacked an R photoelectric conversion film 15 that absorbs a wavelength R of light (hereinafter, referred also to as "R-light") and produces an R component of signal charge commensurate therewith, an G photoelectric conversion film 19 that absorbs a wavelength G of light (hereinafter, referred also to as "G-light") and produces a G component of signal charge commensurate therewith, and a B photoelectric conversion film 23 that absorbs a wavelength B of light (hereinafter, referred also to as "B-light") and produces a B component of signal charge commensurate therewith, in this order. Note that the stacking order of the photoelectric conversion films is not limited to that. Meanwhile, the photoelectric conversion films each preferably use an organic material. The number of the photoelectric conversion films stacked is not necessarily three but satisfactorily two or more.

As shown in FIG. 1, in a surface of the n-type semiconductor substrate 1, there are formed are an $n^+$ region 3 that is a high-concentration n-type impurity region to store the signal charge caused at the R photoelectric conversion film 15, an $n^+$ region 4 that is a high-concentration n-type impurity region to store the signal charge caused at the G photoelectric conversion film 19, and an $n^+$ region 5 that is a high-concentration n-type impurity region to store the signal charge caused at the B photoelectric conversion film 23. The $n^+$ regions 3-5, arranged in a column direction (in a Y direction in FIG. 1), correspond to one pixel so that pixels are arranged in row (in an X direction in FIG. 1) and column directions in a square grid form. From one pixel, a signal is to be obtained that is commensurate with the R, G and B signal charges detected at the equal points on the respective photoelectric conversion films. Accordingly, based on that signal, one-pixel data can be produced.

Over the n-type semiconductor substrate 1, there are formed a vertical transferer 50 where the signal charges stored in the $n^+$ regions 3-5 are read out and transferred in the column direction, a horizontal transferer 30 where the signal charges transferred from the vertical transferers 50 are transferred in the row direction, and an output section 40 that externally outputs a signal commensurate with the signal charge transferred from the horizontal transferer 30. In this manner, a solid-state imaging device 100 is constructed to read out a signal by means of a CCD signal read-out section including the vertical transferer 50, the horizontal transferer 30 and the output section 40. Note that the signal read-out section may be of the MOS type.

As shown in FIG. 2, the R photoelectric conversion film 15 is sandwiched between a pixel-electrode film 14 where to move the charge (generally electrons), for use in producing image data, of the charges generated in the R photoelectric conversion film 15 and a counter electrode film 16 arranged opposite to the pixel-electrode film 14. From now on, the pixel-electrode film 14, the R photoelectric conversion film 15 and the counter-electrode film 16, included as a set in one pixel, are referred to as an R photoelectric converter.

The G photoelectric conversion film 19 is sandwiched between a pixel-electrode film 18 where to move the charge, for use in producing image data, of the charges generated in the G photoelectric conversion film 19 and a counter electrode film 20 arranged opposite to the pixel-electrode film 18. From now on, the pixel-electrode film 18, the G photoelectric conversion film 19 and the counter-electrode film 20, included as a set in one pixel, are referred to as a G photoelectric converter.

The B photoelectric conversion film 23 is sandwiched between a pixel-electrode film 22 where to move the charge, for use in producing image data, of the charges generated in the B photoelectric conversion film 23 and a counter electrode film 24 arranged opposite to the pixel-electrode film 22. From now on, the pixel-electrode film 22, the B photoelectric conversion film 23 and the counter-electrode film 24, included as a set in one pixel, are referred to as a B photoelectric converter.

The pixel-electrode films 14, 18, 22 are demarcated on a pixel-by-pixel basis. The counter electrode films 16, 20, 24 are usable commonly for all the pixels, and hence not separated on a pixel-by-pixel basis. Alternatively, those may be arranged with demarcation. Likewise, the photoelectric conversion films may be arranged with demarcation. The counter electrode films 16, 20, 24 each can be made of ITO (indium tin oxide) or $SnO_2$, but the invention is not limited thereto.

Between the G photoelectric conversion film 19 and the R photoelectric conversion film 15, there is provided a transmission-blocking film 26 sandwiched between a transparent insulation film 17 and a transparent insulation film 27. The transmission-blocking film 26 is to block the transmission of the G portion of light to be absorbed in the G photoelectric conversion film 19 located above and nearest to the transmission-blocking film 26.

Between the B photoelectric conversion film 23 and the G photoelectric conversion film 19, there is provided a transmission-blocking film 28 sandwiched between a transparent insulation film 21 and a transparent insulation film 29. The transmission-blocking film 28 is to block the transmission of the B portion of light to be absorbed in the B photoelectric conversion film 23 located above and nearest to the transmission-blocking film 28.

The transparent insulation films 17, 21, 27 and 29 each can be made of $SiO_2$, but the invention is not limited thereto.

The transmission-blocking film 28 serves to absorb B light to be absorbed in the B photoelectric conversion film 23 provided above the transmission-blocking film 28 but transmit R and G light other than B light. The film having such a property can be made of a sharp-cut filter, a yellow filter or the like to block B light.

The transmission-blocking film 26 serves to absorb G light to be absorbed in the G photoelectric conversion film 19 provided upper the transmission-blocking film 26 but transmit R and B light other than G. The film having such a property can be made of a sharp-cut filter, a magenta filter or the like to block G light.

Incidentally, the transmission-blocking film 26 can use an R color filter that blocks B light in addition to G light because the transmission of B light is not essentially. Namely, the transmission-blocking film 26 may serve to block the transmission of B light that is to be absorbed by the B photoelectric conversion film 23. Where the transmission-blocking film 26 uses a sharp cut filter, a magenta filter or the like to block G light, an increased amount of light is to enter the R photoelectric conversion film 15, leading to sensitivity improvement.

"25" in FIG. 2 is a (transparent) protective film.

A p-well layer 2 is formed in a surface of the n-type semiconductor substrate 1. An $n^+$ region 3 is formed in a surface of the p-well layer 2. Connection is provided between the pixel electrode film 14 and the $n^+$ region 3 by a vertical line 36. This provides an electric connection between the R photoelectric conversion film 15 and the $n^+$ region 3. The vertical line 36 is arranged in electrical insulation from those except for the pixel electrode film 14 and $n^+$ region 3 in connection therewith. In the $n^+$ region 3, the signal charge generated in the R photoelectric conversion film 15 is to flow through the pixel electrode film 14 and vertical line 36 and stored. The vertical line 36 can be made of conductive material such as tungsten, but the invention is not limited thereto.

Incidentally, although the n+ region 3 was illustrated in its section, the n+ regions 4, 5 are similar in section to FIG. 2 excepting that the n+ region shown in FIG. 2 is changed as an n+ region 4 or 5 wherein the vertical line 36 is connected to the pixel electrode film 18 for the case with the n+ region 4 and to the pixel electrode film 22 for the case with the n+ region 5. Accordingly, the n+ regions 4, 5 is omitted to explain in their sections.

Referring back to FIG. 2, an n region 6 is formed on the right of the n+ region 3 with a somewhat spacing, as an n-type impurity region lower in concentration than the n+ region 3 extending in the Y direction. Over the n region 6, a transfer electrode 11 is formed of polysilicon extending up to the above of the n+ region 3 and serving also as a read-out electrode. A shielding film 12 is formed over the transfer electrode 11. The shielding film 12 can be made of silicide film including refractory metal such as tungsten, but the invention is not limited thereto. The n region 6 and the transfer electrode 11 constitute a vertical transferer 50. By applying a read out pulse of a high voltage to the transfer electrode 11, the overlap region g of the p-well region 2 with the transfer electrode 11, between the n+ region 3 and the n region 6, turns into a signal read-out region from which the signal charge stored in the $n^+$ region 3 is to be read out. The signal charge, stored in the n+ region 3, is to be read out to the n region 6 by way of the signal read-out region.

An element isolation region 7 is provided in a region left adjacent the n+ region 3, by a $p^+$ region higher in concentration than the p-well layer 2, or of silicon oxide or the like. This provides an isolation from the adjacent vertical transferer 50. On the extreme surface of the n-type silicon substrate 1, a silicon oxide film 10 is formed on which the transfer electrode 11 is formed.

The shielding film 12 and the transfer electrode 11 are buried in a transparent insulation layer 13.

In case the light of from a subject enters the solid-state imaging device thus structured, B component of the incident light is absorbed in the B photoelectric conversion film 23, to cause hole-electron pairs in an amount commensurate with the absorption amount of light. In this state, in case voltage is applied to the B photoelectric conversion film 23 by applying a predetermined voltage to between the pixel electrode film 22 and the counter electrode film 24, the electrons generated at the B photoelectric conversion film 23 flow from the pixel electrode film 22 through the vertical line 36 to the n+ region 5, thus being stored therein.

The light passed through the B photoelectric conversion film 23 enters the transmission-blocking film 28 where the unabsorbed portion of B light in the B photoelectric conversion film 23 is absorbed therein thus blocking the transmission of B light. Thus, only the R and B components of light are allowed to transmit through the transmission-blocking film 28 and enter the G photoelectric conversion film 19.

Of the incident light entered the G photoelectric conversion film 19, G light is absorbed in the G photoelectric conversion film 19 and hole-electron pairs occur commensurate with the absorption amount of light. In this state, in case voltage is applied to the G photoelectric conversion film 19 by applying a predetermined voltage to between the pixel electrode film 18 and the counter electrode film 20, the electrons generated at the G photoelectric conversion film 19 flow from the pixel electrode film 18 through the vertical line 36 to the n+ region 4, thus being stored therein.

The light passed through the G photoelectric conversion film 19 enters the transmission-blocking film 26 where the unabsorbed portion of G light in the G photoelectric conversion film 19 is absorbed therein thus blocking the transmission of G light. Thus, only the R component of light is allowed to transmit through the transmission-blocking film 26 and enter the R photoelectric conversion film 15.

Of the incident light entered the R photoelectric conversion film 15, R light is absorbed in the R photoelectric conversion film 15 and hole-electron pairs occur commensurate with the absorption amount of light. In this state, in case voltage is applied to the R photoelectric conversion film 15 by applying a predetermined voltage to between the pixel electrode film 14 and the counter electrode film 16, the electrons generated at the R photoelectric conversion film 15 flow from the pixel electrode film 14 through the vertical line 36 to the n+ region 3, thus being stored therein.

The electrons stored in the n+ region 3, 4, 5 are transferred through the vertical and horizontal transferers 50, 30 and then converted into a signal by the output section 40, thus being outputted.

As described above, according to the solid-state imaging device 100, the unabsorbed portion of B light in the B photoelectric conversion film 23 can be prevented from entering the G photoelectric conversion film 19 or the R photoelectric conversion film 15. In addition, the unabsorbed portion of G light in the G photoelectric conversion film 19 can be prevented from entering the R photoelectric conversion film 15. Therefore, color separation is to be done to full extent, thus enabling to take an image with quality.

Explanation was made so far on the example having the three levels of photoelectric conversion films. However, with photoelectric conversion films in two or four or more levels, color separation is made possible to full extent by providing transmission-blocking films between the photoelectric conversion films in a manner to block particular wavelengths of light. In such a case, the particular wavelength of light satisfactorily includes at least a wavelength region of light to be absorbed in the photoelectric conversion film provided upper and nearest to the relevant transmission-blocking film.

Figure 3:
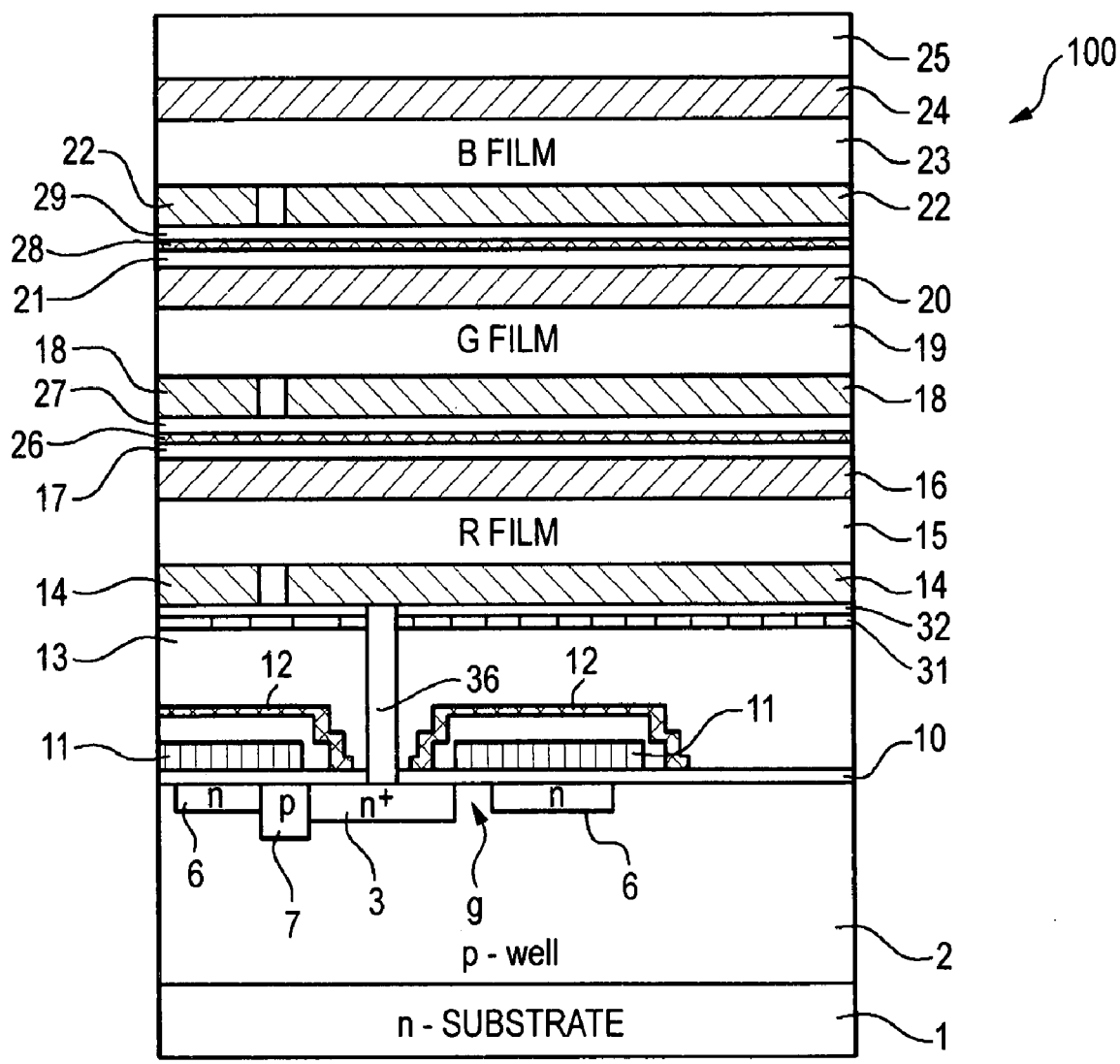
FIG. 3 is a sectional view showing a modification to the FIG. 1 solid-state imaging device, taken on line A-A.

Meanwhile, the light, entered the R photoelectric conversion film 15 located in the lowest level, is reduced in light amount by the absorption in the films stacked above the R photoelectric conversion film 15, thus possibly making the sensitivity-to-R lower than that of another color. In order to prevent the lowering of sensitivity, a light-reflection film 31 is preferably provided between the R photoelectric conversion film 31 and the semiconductor substrate 1, as shown in FIG. 3. The reflection film 31 is formed on the insulation film 13. On the reflection film 31, a transparent film 32 is formed on which the pixel electrode film 14 is formed.

With the structure as shown in FIG. 3, the unabsorbed portion of R light through the R photoelectric conversion film 15 is reflected by the reflection film 31 into the R photoelectric conversion film 15 and absorbed therein. This improves the sensitivity to R light.

This application claims foreign priority from Japanese Patent Application No. 2006-113644, filed Apr. 17, 2006, the entire disclosure of which is herein incorporated by reference.

What is claimed is:

1. A solid-state imaging device comprising:
    a semiconductor substrate;
    a plurality of photoelectric conversion films stacked above the semiconductor layer and absorbing different wavelength regions of light; and
    at least one transmission-blocking film between the plurality of photoelectric conversion films, the at least one transmission-blocking film blocking a transmission of a particular region of light, the particular region of light having a wavelength in a region to be absorbed in a photoelectric conversion film located above and nearest to the at least one transmission-blocking film.

2. The solid-state imaging device according to claim 1, wherein the at least one transmission-blocking film absorbs the particular region of light to block the transmission of the particular region of light.

3. The solid-state imaging device according to claim 1, wherein the at least one transmission-blocking film transmits a wavelength region of light, the wavelength region being absorbed in a photoelectric conversion film located lower than the at least one transmission-blocking film.

4. The solid-state imaging device according to claim 1, further comprising a light-reflection film between the semiconductor substrate and a photoelectric conversion film located nearest to the semiconductor substrate.

* * * * *